United States Patent
Bohlender et al.

(10) Patent No.: US 9,273,882 B2
(45) Date of Patent: Mar. 1, 2016

(54) ELECTRICAL HEATING DEVICE WITH A PLATE ELEMENT COMPRISING CONDUCTIVE PATHS

(75) Inventors: Franz Bohlender, Kandel (DE); Kurt Walz, Hagenbach (DE); Robert Götzelmann, Karlsruhe (DE); Michael Niederer, Kapellen Drusweiler (DE); Dieter Emanuel, Annweiler (DE)

(73) Assignee: Eberspacher catem GmbH & Co. KG, Herxheim (DE)

( * ) Notice: Subject to any disclaimer, the term of this patent is extended or adjusted under 35 U.S.C. 154(b) by 32 days.

(21) Appl. No.: 13/433,513

(22) Filed: Mar. 29, 2012

(65) Prior Publication Data

US 2012/0248091 A1 Oct. 4, 2012

(30) Foreign Application Priority Data

Mar. 30, 2011 (EP) .................................. 11002637

(51) Int. Cl.
*H05B 3/06* (2006.01)
*H05B 3/20* (2006.01)
(Continued)

(52) U.S. Cl.
CPC ............... *F24H 1/121* (2013.01); *F24H 1/009* (2013.01); *F24H 3/0405* (2013.01); *H05K 3/202* (2013.01);
(Continued)

(58) Field of Classification Search
CPC ....... F24H 3/0405; F24H 1/009; F24H 1/121; H05K 2201/10303; H05K 3/202; H05K 3/326
USPC ................. 219/202, 530, 532, 540, 542, 548; 439/43, 44, 50, 375
See application file for complete search history.

(56) References Cited

U.S. PATENT DOCUMENTS 5,820,972 A * 10/1998 Hayashi ........................ 428/209
7,064,301 B2 * 6/2006 Han et al. ..................... 219/540
(Continued)

FOREIGN PATENT DOCUMENTS

| CN | 2141534 Y | 9/1993 | |
|---|---|---|---|
| DE | 10 2009 026 459 A1 | 5/2009 | |
| DE | EP2236330 A1 * | 10/2010 | ............... H05B 3/06 |
| JP | H05-038796 | 5/1993 | |

OTHER PUBLICATIONS

European Search Report Dated Aug. 10, 2011 for European Patent Application Serial No. EP 11 00 2637.

*Primary Examiner* — Dana Ross
*Assistant Examiner* — James Sims, III
(74) *Attorney, Agent, or Firm* — Boyle Fredrickson, S.C.

(57) ABSTRACT

An electrical heating includes a plurality of electrical heating elements which are held by a housing and which abut heat conducting surfaces over which a medium to be heated flows. The electrical heating elements comprise contact lugs, arranged essentially at the same height, that are connected through a plate element. The plate element includes conductive paths and contact lug receptacles for the contact lugs. The plate element may include a carrier plate of non-conducting material and a stamped out metal plate that are joined together to form one unit. A method of manufacturing a plate element includes manufacturing the carrier plate by injection moulding and subjecting a metal plate to stamping operations to form area elements which are joined together by connecting ridges and in which the contact lug receptacles are located. The carrier plate and the metal plate are then joined, and the connecting ridges are then parted.

15 Claims, 6 Drawing Sheets

(51) Int. Cl.
*F24H 1/12* (2006.01)
*F24H 1/00* (2006.01)
*F24H 3/04* (2006.01)
*H05K 3/20* (2006.01)
*H05K 3/32* (2006.01)

(52) U.S. Cl.
CPC ...... *H05K 3/326* (2013.01); *H05K 2201/10303* (2013.01); *Y10T 29/49128* (2015.01); *Y10T 29/49368* (2015.01)

(56) References Cited

U.S. PATENT DOCUMENTS

| | | |
|---|---|---|
| 2005/0205552 A1 | 9/2005 | Han et al. |
| 2008/0000889 A1* | 1/2008 | Niederer et al. ............... 219/205 |
| 2008/0057773 A1* | 3/2008 | Ingenbleek et al. .......... 439/374 |
| 2010/0243638 A1 | 9/2010 | Niederer et al. |

* cited by examiner

ELECTRICAL HEATING DEVICE WITH A PLATE ELEMENT COMPRISING CONDUCTIVE PATHS

BACKGROUND OF THE INVENTION

1. Field of the Invention

The present invention relates to an electrical heating device with a plurality of electrical heating elements, which are held by a housing and abut heat conducting surfaces over which the medium to be heated can flow. The heating elements of the electrical heating device are provided with contact lugs for their electrical connection. All or some of the contact lugs are arranged essentially at the same height and are connected by a plate element which is provided with conductive paths and comprises contact lug receptacles for electrically contacting the contact lugs.

2. Description of the Related Art

An electrical heating device of this nature is known for example from EP 1 872 986 A1 which originates from the applicant. With this state of the art the housing forms a chamber in which the heat of the electrical heating elements is transferred to a liquid medium. For this purpose the electrical heating elements are located in several U-shaped heating chambers and are in thermal conducting contact with the walls of the heating chambers, over which the liquid flows on the outside.

A generic electrical heating device can however also be formed by an electrical auxiliary heater for heating the air in the vehicle passenger compartment. In this case the housing is normally formed by a frame in which a plurality of electrical heating elements are held in a layer structure, which comprises radiator elements, which abut the electrical heating elements and over which the air to be heated flows. The electrical heating elements here also comprise PTC elements with sheet metal bands abutting them on both sides. Single sheet metal bands are brought out over the layer structure to form contact lugs at the side. An electrical heating device of this nature is for example described in EP 1 157 867 A1.

With the generic heating devices there is the necessity of simply contacting the electrical heating elements. Here, normally the electrical heating elements are pre-assembled in the housing before any electrical connection is made to the electrical heating elements. Consequently, often a plug connection is required which facilitates a simple but effective and permanent electrical connection to the contact lugs of the electrical heating elements.

SUMMARY OF THE INVENTION

The electrical heating device known from EP 1 872 986 A1 has a plurality of electrical heating elements provided in parallel rows. Each heating element has two contact lugs, which each have to be connected via the plate element. In this respect EP 1 872 986 A1 discloses a conductor board with conductive paths for the relevant contact lugs and contact lug receptacles which are electrically connected to the conductive paths, groups various contact lugs to a heating circuit and furthermore bears flat plugs. These flat plugs are accommodated in receptacles of a further conductor board and are electrically connected to the said conductor board, which comprises the circuit for the open and closed-loop control of the electrical heating device and by which the individual heating circuits can be switched.

The manufacture of a circuit board is however cost-intensive. Furthermore, due to the specific conductive paths, the circuit board does not allow any adaptation for forming different heating circuits or different conductive paths. Furthermore, the contact lug receptacles are, for example, soldered onto the conductor board and are thus electrically connected to the conductive paths. This requires not only an elaborate manufacturing method, but furthermore limits the temperature at which the prior-art plate elements can be used.

An intention of this present invention is to provide a plate element comprising conductive paths, which can be more simply and more cost-effectively manufactured. Furthermore, an intention of this present invention is to specify a method of manufacturing a plate element.

For the solution of the device-related problem the present invention specifies an electrical heating device having the features of Claim 1. This differs from the prior-art electrical heating device in that the plate element comprises a carrier plate of a non-conducting material and a stamped metal plate. The carrier plate and the stamped metal plate are connected to form one unit.

The carrier plate is normally manufactured from an electrically non-conducting plastic, preferably by means of injection moulding, so that the carrier plate can comprise further functional surfaces or elements, which facilitate installation in or on the housing, which serves the completion of the housing or the assembly of further components such as the electronics or cable routing. As a plastic, Procan, PPT GF30 (CTI 600) or another relatively heat resistant plastic can be considered. This offers the possibility of subjecting the plate element to higher temperatures, in particular when the electrical interface to the metal plate occurs solely via plugging and without any solder connection. The component providing the structural integrity of the plate element, i.e. the carrier plate, can be formed as required and is only limited by the possibilities of manufacture by injection moulding. With the plate elements according to the invention the conductive paths are however formed by a stamped metal plate. This stamped metal plate can be prepared economically and then connected to the carrier plate.

The joining of the various components for the electrical interface of the electrical heating elements to the plate elements can be thus avoided in that the contact lug receptacles are formed in one part by stamping and bending on the metal plate, as is suggested in a further development. For this purpose the metal plate is formed preferably from a hard-drawn, well contacting material, such as for example CuSnNi1Mg, which is coated with a thin coating of a few μm of silver and/or copper/tin. Here, for the defined contacting of the contact lugs on oppositely situated lateral faces of the contact lugs, the contact lug receptacles have abuttable contact springs which abut the contact lugs under a certain tension.

The invention therefore offers the possibility of forming the conductive paths and the elements required for the connection of the contact lugs as one part by stamping and bending of a metal plate which, for stiffening and positioning on the housing, is joined to the carrier plate which is specially formed for this and is manufactured from economical plastic.

For the further simplification of the electrical connection, according to a preferred embodiment of the present invention, it is suggested that at least one flat plug is provided which is held by a flat plug holder formed as one part on the carrier plate. The flat plug(s) normally protrude from the carrier plate on one side and namely on the upper side facing away from the metal plate. For the electrical contacting of the flat plug the metal plate comprises a flat plug contact receptacle correspondingly formed to the flat plug. This flat plug contact receptacle is also preferably provided with contact springs so that electrical contacting of the flat plug occurs solely by insertion of the said plug into the flat plug contact receptacle.

Following that, the stamped metal plate of the plate element according to the present invention comprises conductive paths and receptacles for the contact lugs on one hand and the flat plugs on the other, preferably only cut out by stamping, through which electrical contacting occurs directly to the conductive paths by insertion of the contact lug or the flat plug. The plate element of the present invention can therefore easily make contact to the electrical heating elements and to a power supply or a circuit for this purpose. The plate element with the features of Claim 1 and the further development according to the claims dependent on it can also be essential to the invention on its own and without the electrical heating device.

The flat plug is preferably formed from a sheet metal strip and has at least one locking protrusion which protrudes from the lateral faces of the sheet metal strip and is made by stamping and bending. The flat plug locks to the flat plug holder through this locking protrusion. Normally, the flat plug holder comprises an undercut for this which is formed next to an insertion and retaining channel for the flat plug and in which the locking protrusion clips in after the locking protrusion has passed the said channel. The locking protrusion then, due to the abutment to the undercut, prevents the flat plug from being pulled out in the opposite direction.

For an easy connection between the carrier plate and the stamped metal plate retaining elements are provided on the carrier plate, preferably formed as one part, by which the metal plate can be locked to the carrier plate. The joining movement then preferably leads to a positive locking joint between the stamped metal plate and the carrier plate.

The carrier plate here normally has a plurality of appropriate retaining elements which are formed as one part on the carrier plate. Normally, they grip over at least the marginal region of the stamped metal plate.

For the secure and all-over attachment of the metal plate to the carrier element the metal plate comprises a retaining opening assigned to the retaining element which is penetrated by the retaining element for locking with respect to the metal plate. Often the stamped metal plate comprises a plurality of retaining openings of this nature also in its central area. Thus, the stamped metal plate is locked to the carrier plate and therefore securely held not only at the edge, but also at various points in its central region and preferably over its complete longitudinal extension.

Particularly secure locking arises according to a preferred embodiment of the present invention in which the retaining opening is bridged essentially centrally by a retaining element ridge, which is formed in one part on the carrier plate and from which spring bars formed on it on both sides and latching lugs provided on it, gripping behind the metal plate, protrude downwards.

According to a preferred further development of the present invention, the metal plate has a plurality of area elements which are assigned to a heating circuit of the electrical heating device and which group the electrical conductive paths. These area elements are initially connected together by connecting ridges so that the metal plate can be prepared as a uniform component by stamping and bending. At least one of the flat plugs is assigned to each individual area element. The carrier plate comprises stamped openings which leave the connecting ridges free. The connecting ridge normally penetrates an appropriate stamped opening approximately centrally. The stamped opening, normally formed by means of injection moulding, facilitates the penetration of the connecting ridges after assembly of the stamped metal plate in order to electrically insulate the individual area elements from one another. Here, normally at least one of the retaining elements is assigned to each individual area element on the carrier-plate side.

According to the co-ordinated method-related aspect of the present invention, the plate element comprising the conductive paths is manufactured in that initially the metal plate for forming the conductive paths as well as the area elements joined together by connecting ridges and the contact lug receptacles provided in the area elements is processed by stamping or bending. Joining to the carrier plate only occurs thereafter. According to the invention this is manufactured from plastic by means of injection moulding. The connecting ridges are only parted after the joining process in order to electrically isolate the previously uniformly manufactured and mutually connected area elements. Often the carrier plate is initially manufactured independently of the metal plate. However, it cannot be excluded that both components are joined by overmoulding the metal plate and the carrier plate is manufactured at the same time.

Within the scope of the method according to the invention, during joining, preferably each area element is joined positively locked to the carrier plate in order to hold the individual area elements securely on the carrier plate even after the connecting ridges are parted.

According to a further preferred embodiment of the technique according to the invention, the flat plug is inserted into the assigned flat plug holder after the carrier plate and metal plate have been joined. At the end of this insertion movement, which is normally specified by an insertion stop formed on the flat plug, the flat plug locks in the flat plug contact holder and flat plug contact receptacles formed on the plate element come into electrical contact with the corresponding flat plugs in a plugged connection. Consequently, within the scope of the insertion movement a mechanical attachment of the flat plug and also an electrical coupling to the stamped metal plate are produced.

BRIEF DESCRIPTION OF THE DRAWINGS

Further details and advantages of the present invention are given in the following description of an embodiment in conjunction with the drawing. This shows the following.

DETAILED DESCRIPTION OF THE PREFERRED EMBODIMENT

Figure 1:
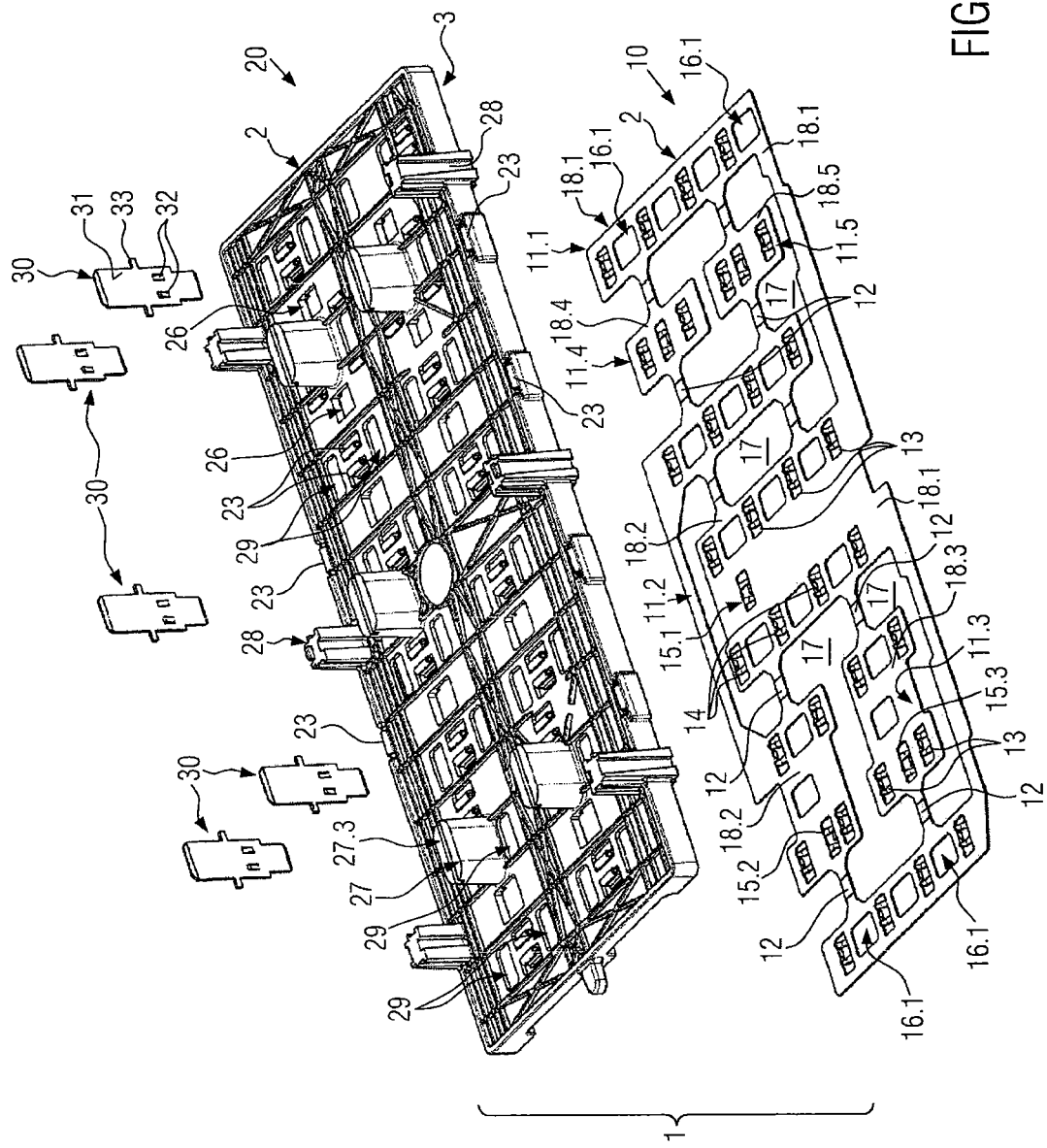
FIG. 1 a perspective exploded illustration of an upper-side view of a plate element according to the embodiment.
Figure 2:
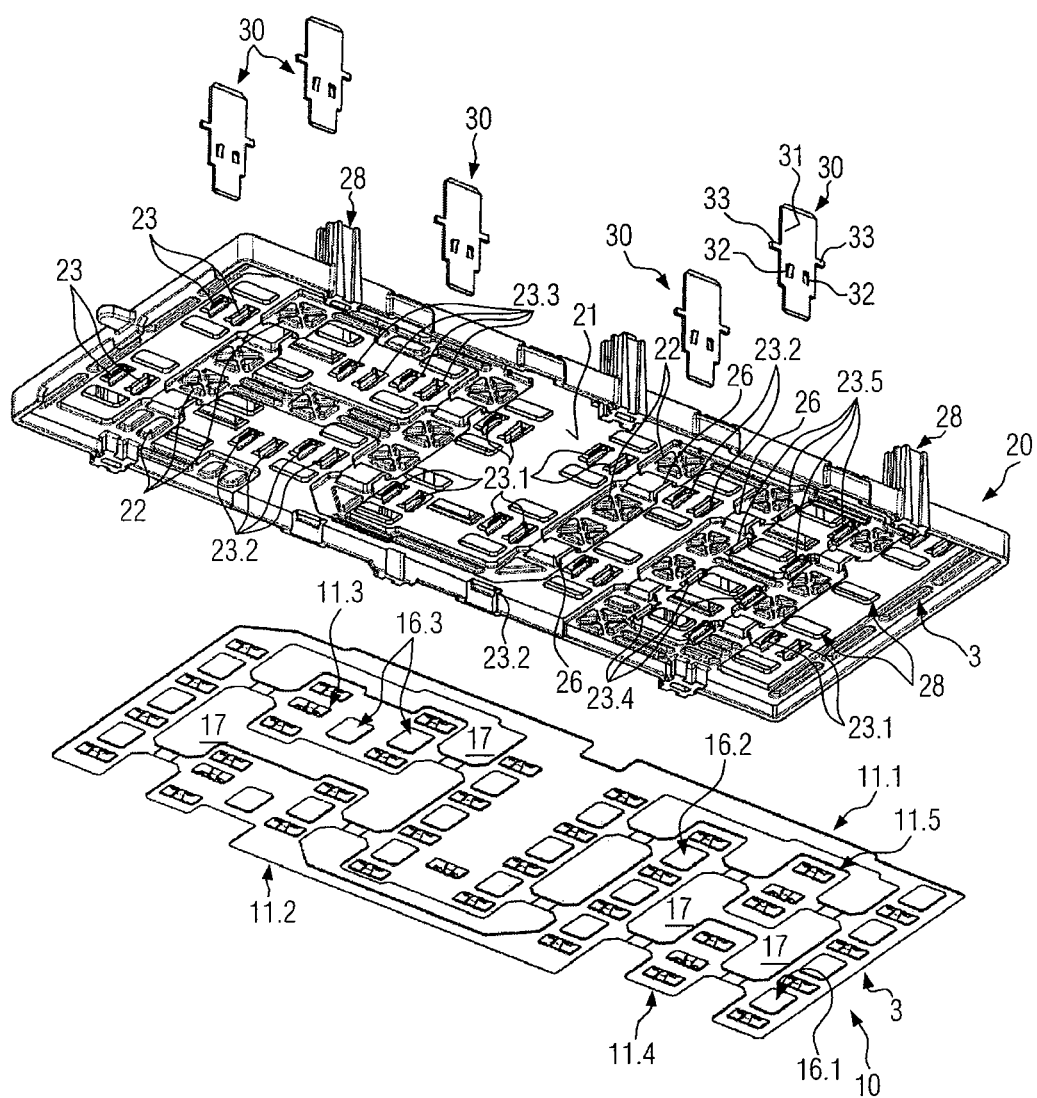
FIG. 2 a perspective exploded illustration of an underside view of a plate element according to the embodiment.

The component in the figures is the plate element of a heating device, which is already known from, for example, EP 1 872 986 A1, with a plurality of electrical heating elements arranged in parallel rows. In this respect reference is made to the specific description of EP 1 872 986 A1. The disclosure of this patent application is included by reference in the disclosure of this present application. In the following specific description only the component designated as a distributor plate in EP 1 872 986 A1 is dealt with in detail.

This plate element is labelled in the figures with reference numeral 1 and consists of a metal plate 10, a carrier plate 20 and a plurality of flat plugs 30.

Furthermore, in the figures the upper side of the relevant component is labelled with reference numeral 2 and the underside with reference numeral 3.

The metal plate 10 is formed by stamping and bending a hard-drawn contact material, such as for example CuSnNi1Mg with a 2.5 µm thick silver coating. Due to the stamping operations the metal plate is reshaped to a grid-shaped form. The metal plate 10 has five area elements 11, which are each connected to one another by connecting ridges 12. Each area element 11 has a plurality of contact lug receptacles 13, which are formed by cutting an insertion opening leaving the contact springs 14, which protrude downwards from oppositely situated margins of the insertion opening. These stamped out contact springs are arranged with respect to the upper side 2 of the metal plate 10 by bending such that from the underside 3 a slight funnel-shaped taper to the tips of the contact springs 14 is produced.

Figure 3:
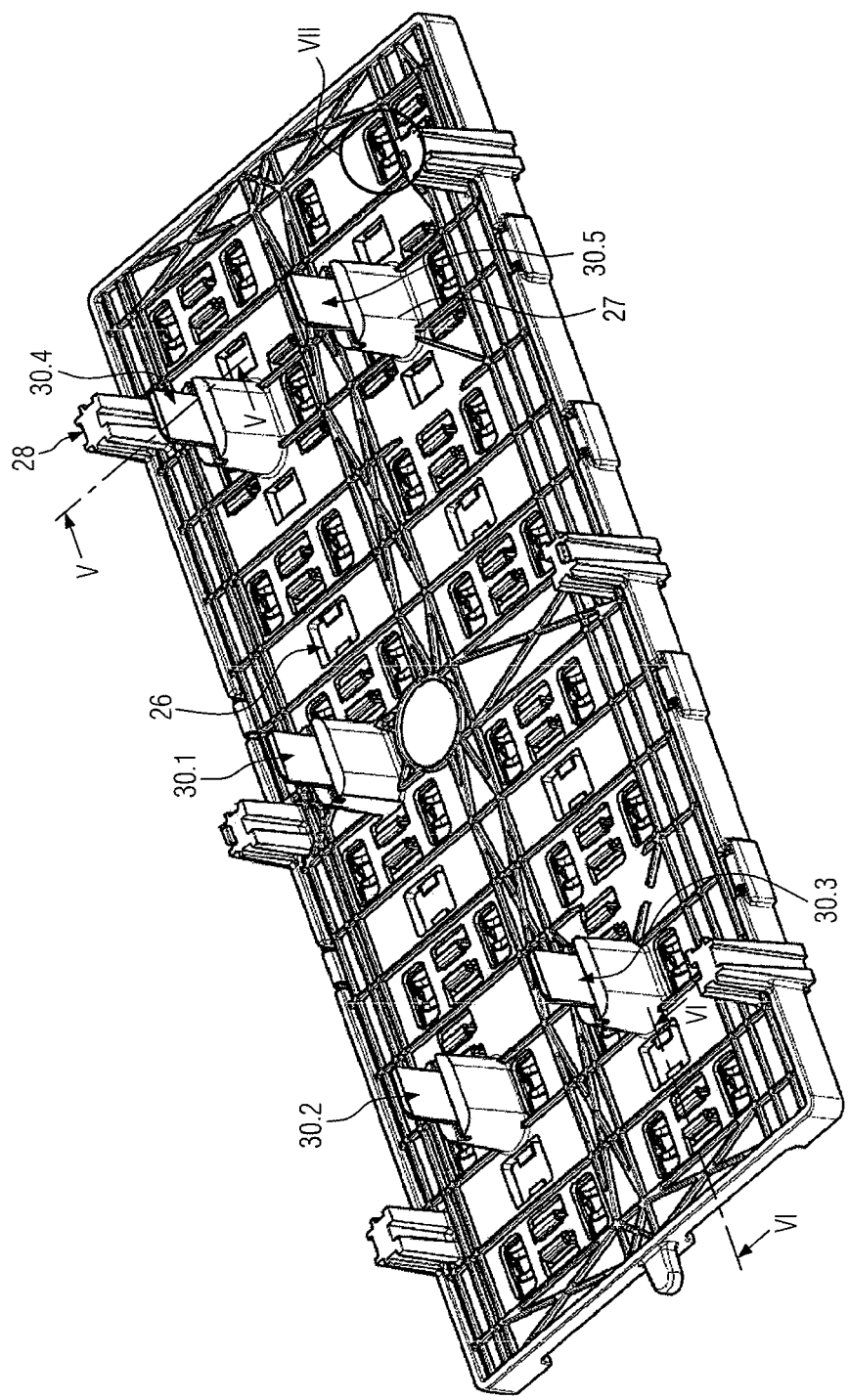
FIG. 3 a perspective plan view of the upper side of the embodiment illustrated in FIGS. 1 and 2 after the joining of all components.

The flat plug contact receptacles labelled with reference numeral 15 are also provided with appropriate contact springs 14. For each area element 11.1 to 11.5 a flat plug contact receptacle 15.1 to 15.5 is provided (FIG. 3).

Furthermore, rectangular retaining openings 16 and inner openings 17 are formed on the metal plate 10 by stamping. The remaining material of the metal plate 10 partially forms ridge-shaped, partially planar conductive paths 18. All functional elements and functional areas of the metal plate 10 are solely formed by stamping and stamping/bending operations on a panel-shaped, sheet metal, semi-finished product.

Figure 6:
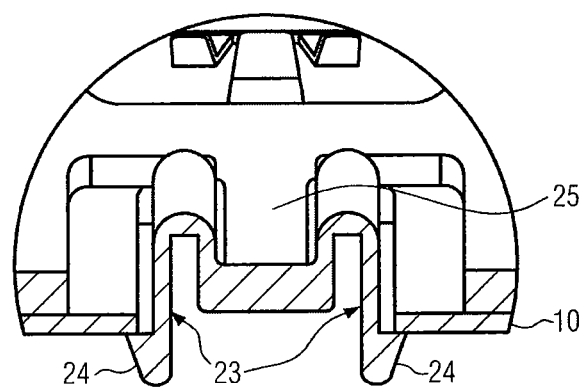
FIG. 6 a cross-sectional view along the line VI-VI according to the illustration in FIG. 3.
Figure 7:
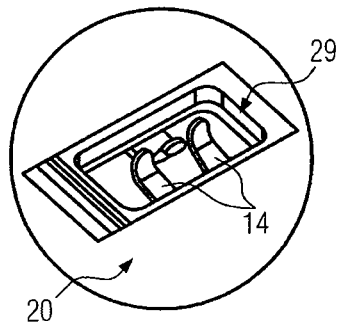
FIG. 7 the detail VII according to FIG. 3.

The carrier plate 20 forms a flat contact base 21 for the metal plate 10, over which stiffening segments 22 extend which penetrate into the inner openings 17 of the metal plate 10. The contour of the stiffening segments 22 essentially corresponds to the marginal contour of the assigned area elements 11, so that the metal plate 10 is aligned relative to the carrier plate 20 and the metal plate 10 can only abut it in the predefined direction relative to the carrier plate 20. The contact base 21 furthermore has spring bars 23 with latching lugs 24 protruding over it which are illustrated enlarged in FIG. 6 and form retaining elements for the positively locked retention of the metal plate 10 on the carrier plate 20. For this the spring bars 23 and the latching lugs 24 pass through the retaining openings 16 and the latching lugs 24 grip behind the underside 3 of the metal plate 10. The spring bars 23 extend from a retaining element ridge 25 which, after the joining the metal plate 10 and carrier plate 20, bridges the retaining openings 16 approximately centrally (cf. FIG. 6). The contact bases 21.4 and 21.5 for the area elements 11.4 and 11.5 are limited at the edge by spring bars 23.4, 23.5 with assigned latching lugs, which in the joined state interact with the margins of the corresponding area elements 11.4 and 11.5 and fix them positively locked.

Also the outer contour of the metal plate 10 is circumferentially gripped, positively locked by spring bars 23.

Corresponding to the position of the connecting ridges 12 the carrier plate 20 comprises stamped openings 26. In the joined state the connecting ridges 12 are located approximately centrally in these stamped openings 26.

The upper side 2 of the carrier plate 20 which can be seen in FIG. 1 has five flat plug holders 27 and in each case three supports 28 distributed on the longitudinal side protruding over it, the said supports terminating at the same height as the flat plug holders 27. Each flat plug holder 27 has an insertion channel 27.1, which is formed adapted to the thickness of the flat plug 30 and which leads to a receiving region 27.2, which is surrounded circumferentially by the plastic material forming the carrier plate 20 and forms an undercut. Finally, corresponding to the contact lugs—or flat plug contact receptacles 13, 15, contact insertion openings 29 are left free on the carrier plate 20.

All previously described elements of the carrier plate 20 are formed with it as one part in the course of the injection moulding of the carrier plate 20.

The flat plug 30 has locking protrusions 32 protruding from oppositely situated lateral faces 31 which are formed by stamping out and bending out of the plane of the sheet of the flat plug 30. Furthermore, insertion stops 33 protrude downwards laterally from the flat plug 30, for the accommodation of which the free face side of the flat plug holder 27 is provided with a groove 27.3.

With the illustrated embodiment initially the carrier plate 20 is made as one part by means of injection moulding from a heat-resistant plastic, for example, PBT. The metal plate 10 is prepared by stamping and bending. Then, the two components 10, 20 are positioned relative to one another. The carrier plate 20 is here normally orientated with its underside 3 facing upwards. After the metal plate 10 is placed in position, a joining tool presses the metal plate 10 against the contact bases 21 of the carrier plate 20. In doing this, the latching lugs 24 latch against the edges of the retaining opening 16 or against the longitudinal edge of the area elements 11.4, 11.5. In a similar manner spring bars 23, provided on the longitudinal edge of the carrier plate 20, latch against the metal plate 10 along its outer contour.

Figure 4:
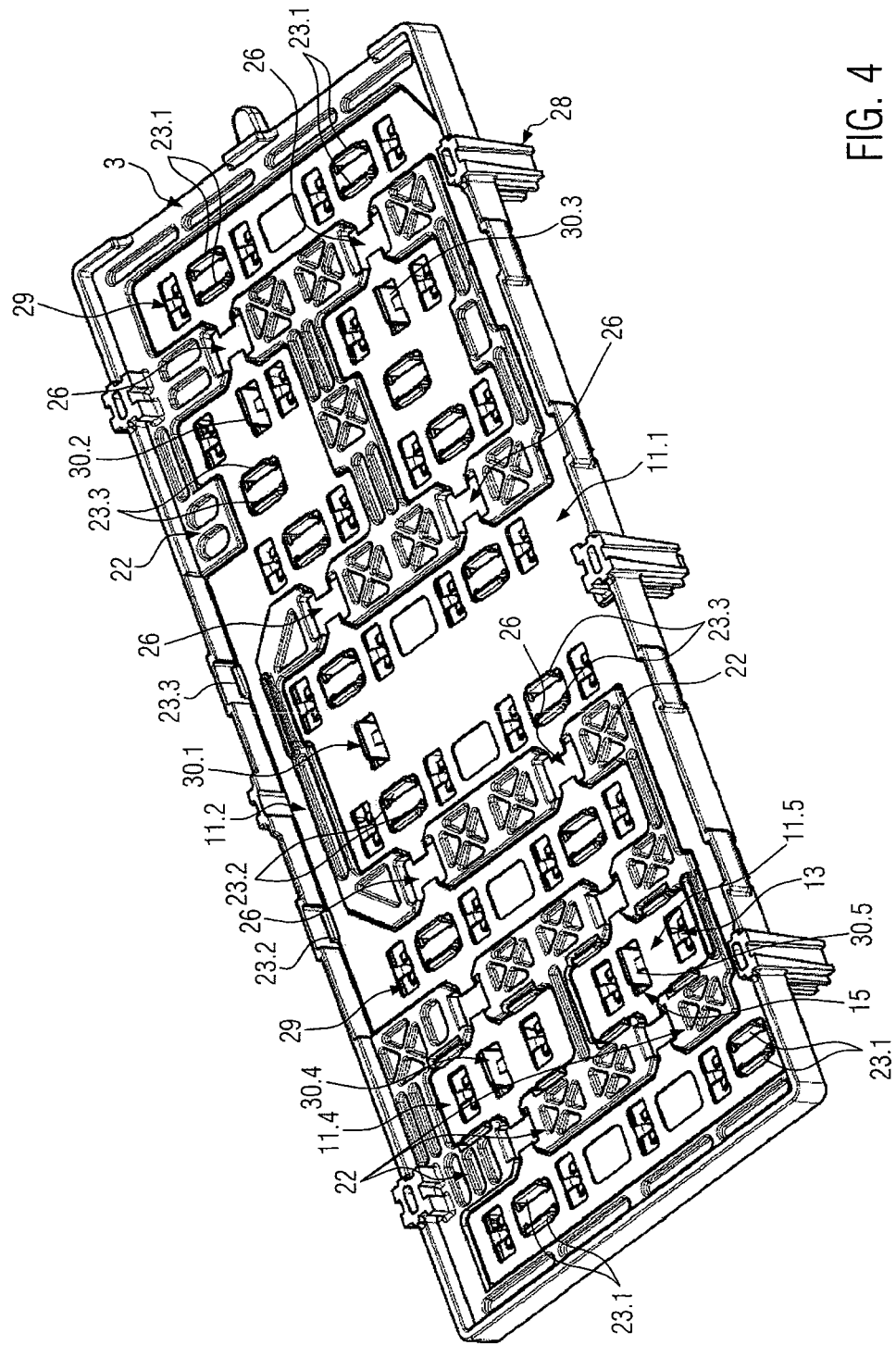
FIG. 4 a perspective plan view of the underside of the embodiment illustrated in FIGS. 1 and 2 after the joining of all components.

Then, a parting operation is carried out by a parting tool, for example by a punching tool, in the course of which the connecting ridges 12 are parted. A punching stamp is introduced through the stamped openings and the connecting ridges 12 sheared off. The rest of the connecting ridges 12 can be seen in particular in FIG. 4 in the region of the stamped openings 26. Five area elements 11.1 to 11.5 are produced electrically isolated from one another.

Figure 5:
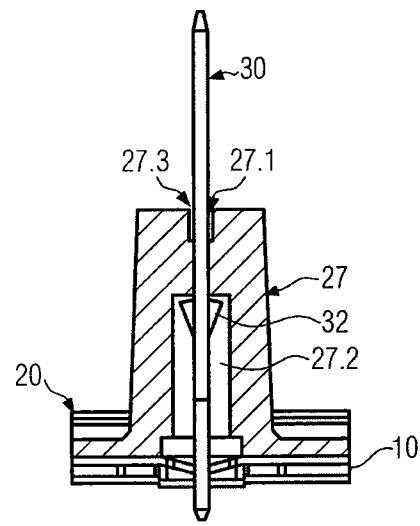
FIG. 5 a cross-sectional view along the line V-V according to FIG. 3.

Thereafter, the flat plugs 30 are introduced from the upper side 2 into the respective insertion channels 27.1 of the assigned flat plug holders 27. Within the scope of this insertion movement the locking protrusions 32 are forced back elastically into the plane of the flat plug material 30. Finally, the tip of the flat plug 30 presses against the contact spring 14 of the flat plug receptacles 15 so that the contact springs 14 of the flat plug receptacles 15, which are initially formed like the contact lug receptacles 13 and which are also taken along, extending beyond the upper side 2 of the metal plate 10 and are bent over extending beyond the underside 3. The exact guidance of the flat plug 30 through the insertion channels 27.1 simplifies this reshaping movement of the contact springs 14. The flat plugs 30 are normally pressed in by machine. The insertion movement of the flat plugs terminates when the insertion stops 33 abut the bottom of the groove 27.3 of the flat plug holder 27. This position is illustrated in FIG. 5 in the sectional illustration.

The plate element 1 prepared in this way is then pushed onto the contact lugs of the individual electrical heating elements to group them into heating circuits according to the area elements 11.1 to 11.5. One of the contact lugs of the relevant electrical heating elements is here always contacted by the area element 11.1, which is connected to ground, whereas the other area elements 11.2 to 11.4 are connected via the assigned flat plugs 30.2 to 30.5 to switches, in particular power switches, which are soldered to a conductor board, which is placed on the supports 28 and face-side ends of the flat plug holders 27 and has flat plug receptacles for the electrical contacting of the flat plugs 30 to the conductive paths (cf. EP 1 872 986 A1).

It is pointed out that with the embodiment the heating circuits can be changed in a simple manner by dispensing with the full removal of all connecting ridges 12.

Figure 8:
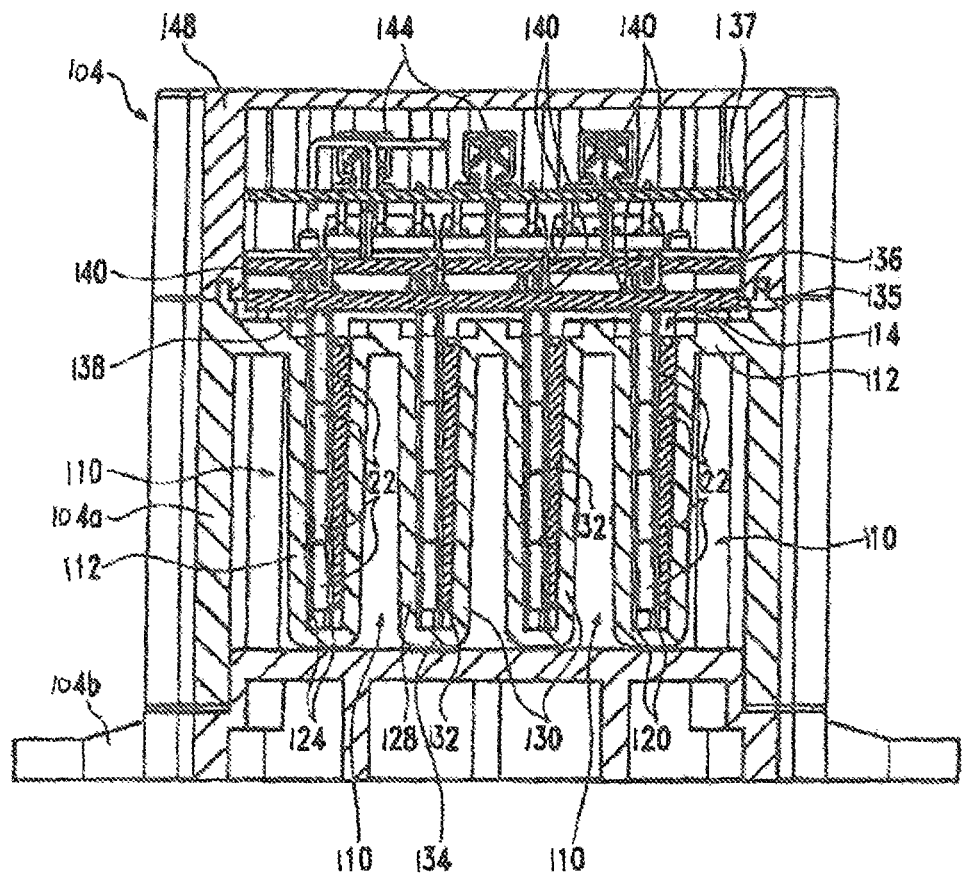
FIG. 8 an embodiment of a heating device.

FIG. 8 shows an embodiment of a heating device with an elongated housing 104, consisting of an essentially cylindrical housing frame 104 and a housing base 104b screwed to it. Connecting pieces are arranged on a lateral surface of the housing frame 104a, on opposite ends of this elongated housing frame 104a, whereby these connecting pieces surround inlet and outlet openings, whereby connection lines can be connected to these connection pieces via hose clips or the like, and whereby these connection lines lead to a circulation chamber 110 that is essentially surrounded by the housing frame 104a. The circulation chamber 110 is separated from a heating chamber 114 above it by a separating wall 112, namely in such a way that the fluid (for example, water) contained in the circulation chamber 110 cannot reach the heating chamber 114. The separating wall 112 can, for example, be formed on to the housing frame 104a as a single piece.

The separating wall 112 forms a number of recesses arranged one behind the other along the width, whereby these recesses essentially extend across the entire length of the housing 104. The separating wall 112 accordingly has a meandering shape with recesses that project deeply into the circulation chamber 110, which recesses are completely sealed off from the circulation chamber 110 and open to the heating chamber 114. Because these recesses are preferably manufactured from a material that is a good conductor, particularly metal and, in this case, especially aluminum, manufacturing the separating wall 112 as, for example, a separate component by means of shaping suggests itself. The recesses have a U-shaped cross-section and run along the length of the housing 104, parallel to one another.

Heating elements are located in each of the recesses. The exterior side of each of the heating elements is formed by ceramic plates 120. A number of PTC heating elements 122 are arranged between these ceramic plates here. Contact plates 124 made of an electrically conducting material are, in turn, located between these PTC heating elements 122 and the ceramic plates 120. Extension sections are formed on to these contact plates 124 as a single piece. The extension sections of the contact plates which lie opposite one another are located on diagonally opposing sides. The extension sections are accordingly spaced apart from one another not only on the basis of the thickness of the PTC heating elements 122 but furthermore also essentially by the width of the heating elements. For reinforcement, the extension sections are doubled by folding the material of the contact plates 124 one time in the thickness.

The ceramic plates 120, the PTC heating elements 122 and the contact plates 124 are preferably combined into one unit by means of gluing. The ceramic plates 120 project beyond the PTC heating elements 122 and the contact plates 124 on all sides, forming an edge around the circumference. The heating elements introduced into the recesses lie on a side piece 128 of the U-shaped recess with one of the ceramic plates 120. Between the opposing side piece 130 and the heating unit is a pressure element 132, which is introduced into the recess under tension and which is assigned to a single electric heating element. The respective pressure element 132 holds a single heating element in the recess and braces it against the opposing side pieces 128, 130 of the recess. The heating element accordingly lies against the opposing side pieces 128, 130 with good heat conduction. Furthermore, the heating elements stand up on a tab 134 of the recess, said tab 134 connecting the side pieces 128, 130, so that the heating elements are accordingly fixed with respect to the height. The electric heating element lies, with the lower face sides of the ceramic plates 120, on the tab 134, so that the electrically conducting parts of the heating element are spaced at a distance from the metallic tab 134 and consequently insulated. The depth of the recesses is furthermore selected in such a way that the medium in the circulation chamber flows around the heating element at least above the height of the PTC heating elements 122 that are stacked one on top of the other, i.e., the entire electric heating element is held in the recess.

What is claimed is:

1. An electrical heating device comprising:
a plurality of electrical heating elements which are held by a housing and which abut heat conducting surfaces over which a medium to be heated flows,
wherein the electrical heating elements comprise contact lugs for an electrical connection,
wherein at least some of the contact lugs, arranged essentially at the same height, are connected through a plate element having conductive paths that are electrically isolated from one another and having contact lug receptacles formed for the electrical contact of the contact lugs,
wherein the plate element comprises a carrier plate and a stamped out metal plate in which the electrically isolated conductive paths and the contact lug receptacles are formed,
wherein the carrier plate has at least one flat plug which is held by a flat plug holder that is formed as one part on the carrier plate extending over it,
wherein the metal plate forms a plurality of area elements which each are assigned to a heating circuit of the electrical heating device and which group the individual electric heating elements,
wherein the area elements are manufactured as a constituent part of a single-part metal plate, and wherein connecting ridges on the metal plate are subsequently parted to electrically isolate the area elements from one another,
wherein at least one of the flat plugs is assigned to one of the area elements,
wherein the carrier plate forms stamped openings which leave the connecting ridges exposed for parting, and
wherein the carrier plate and the stamped out metal plate are connected together.

2. An electrical heating device according to claim 1, wherein the metal plate is locked to the carrier plate through retaining elements formed as one part on the carrier plate.

3. An electrical heating device according to claim 2, wherein a retaining opening is formed on the metal plate and has the retaining element passing through it for latching against the metal plate.

4. An electrical heating device according to claim 3, wherein the retaining opening is bridged essentially centrally by a retaining element ridge of the carrier plate, wherein said retaining element ridge is provided with spring bars formed on both sides thereof, and wherein the spring bars protrude downwards and have latching lugs gripping behind the metal plate.

5. An electrical heating device according to claim 1, wherein the contact lug receptacles are formed as one part by stamping and bending on the metal plate.

6. An electrical heating device according to claim 5, wherein each of the contact lug receptacles comprises contact springs which can abut oppositely situated lateral faces of the contact lugs.

7. An electrical heating device according to claim 1, wherein a flat plug contact receptacle, formed on the metal plate, is assigned to the flat plug and is contacted via a plug connection.

8. An electrical heating device according to claim 1, wherein the flat plug is formed from a sheet metal strip and comprises at least one locking protrusion which protrudes from a lateral face thereof and which is manufactured by stamping and bending and is locked with the flat plug holder.

9. An electrical heating device comprising:
- a plurality of electrical heating elements which are held by a housing and which abut heat conducting surfaces over which a medium to be heated flows, wherein the electrical heating elements comprise contact lugs for an electrical connection, wherein at least some of the contact lugs, arranged essentially at the same height, are connected to one another through a plate element, the plate element having conductive paths that are electrically isolated from one another and having contact lug receptacles formed for the electrical contact of the contact lugs, wherein the plate element comprises a carrier plate and a stamped out metal plate in which the electrically isolated conductive paths are formed, wherein the carrier plate and the stamped out metal plate are connected together,
- wherein the contact lug receptacles comprise a plurality of stamped openings formed in the stamped out metal plate,
- wherein the metal plate is locked to the carrier plate through retaining elements formed as one part on the carrier plate,
- and wherein retaining openings are formed on the metal plate, the retaining elements passing through the retaining openings for latching against the metal plate.

10. An electrical heating device according to claim 9, wherein the carrier plate has at least one flat plug which is held by a flat plug holder formed as one part on the carrier plate extending over it.

11. An electrical heating device according to claim 10, wherein a flat plug contact receptacle, formed on the metal plate, is assigned to the flat plug and is contacted via a plug connection.

12. An electrical heating device according to claim 10, wherein the flat plug is formed from a sheet metal strip and comprises at least one locking protrusion which protrudes from the lateral face and which is manufactured by stamping and bending and is locked with the flat plug holder.

13. An electrical heating device according to claim 10, wherein the metal plate forms a plurality of area elements which each are assigned to a heating circuit of the electrical heating device and which group the individual electric heating elements; and the area elements are manufactured as a constituent part of the metal plate, wherein at least one of the flat plugs is assigned to one of the single area elements, and wherein the carrier plate forms stamped openings which leave connecting ridges free on the metal plate.

14. An electrical heating device according to claim 9, wherein each of the contact lug receptacles comprises contact springs which can abut oppositely situated lateral faces of the contact lugs.

15. An electrical heating device according to claim 9, wherein the retaining opening is bridged essentially centrally by a retaining element ridge of the carrier plate, wherein said retaining element ridge is provided with spring bars formed on both sides thereof, wherein the spring bars protrude downwards and have latching lugs gripping behind the metal plate.

* * * * *